(12) United States Patent
Trifonov

(10) Patent No.: US 8,802,476 B2
(45) Date of Patent: Aug. 12, 2014

(54) SEMICONDUCTOR THERMOCOUPLE AND SENSOR

(71) Applicant: Texas Instruments Incorporated, Dallas, TX (US)

(72) Inventor: Dimitar V. Trifonov, Vail, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/654,591

(22) Filed: Oct. 18, 2012

(65) Prior Publication Data

US 2013/0040413 A1 Feb. 14, 2013

Related U.S. Application Data

(62) Division of application No. 12/750,408, filed on Mar. 30, 2010, now Pat. No. 8,304,851.

(51) Int. Cl.
*H01L 21/768* (2006.01)
*H01L 23/38* (2006.01)
*H01L 27/16* (2006.01)

(52) U.S. Cl.
CPC .............. *H01L 23/38* (2013.01); *H01L 27/16* (2013.01)
USPC ............................................. 438/54

(58) Field of Classification Search
None
See application file for complete search history.

(56) References Cited

U.S. PATENT DOCUMENTS

2004/0208345 A1* 10/2004 Chou et al. .................... 382/124
2007/0278605 A1* 12/2007 Shibayama .................... 257/432

* cited by examiner

*Primary Examiner* — Fernando L Toledo
*Assistant Examiner* — Valerie N Newton
(74) *Attorney, Agent, or Firm* — Alan A. R. Cooper; Frederick J. Telecky, Jr.

(57) ABSTRACT

Conventional "on-chip" or monolithically integrated thermocouples are very mechanically sensitive and are expensive to manufacture. Here, however, thermocouples are provided that employ different thicknesses of thermal insulators to help create thermal differentials within an integrated circuit. By using these thermal insulators, standard manufacturing processes can be used to lower cost, and the mechanical sensitivity of the thermocouple is greatly decreased. Additionally, other features (which can be included through the use of standard manufacturing processes) to help trap and dissipate heat appropriately.

15 Claims, 14 Drawing Sheets

SEMICONDUCTOR THERMOCOUPLE AND SENSOR

CROSS-REFERENCE TO RELATED APPLICATIONS

This application is a divisional of U.S. patent application Ser. No. 12/750,408, entitled "SEMICONDUCTOR THERMOCOUPLE AND SENSOR," filed on Mar. 30, 2010 (now U.S. Pat. No. 8,304,851), which is incorporated herein by reference for all purposes.

TECHNICAL FIELD

The invention relates generally to thermocouples and, more particularly, to monolithically integrated thermopiles.

BACKGROUND

Referring to FIG. 1 of the drawings, the reference numeral 100 generally designates a conventional monolithically integrated or "on-chip" thermocouple. Thermocouple 100 generally comprises a membrane 102 that includes two different thermally conductive materials 110 and 112 that extend from the silicon substrate 104 (which is typically referred to as a "rim") over a recess 108 formed in silicon substrate 104. As heat or infrared radiation is applied to the membrane 102, a temperature differential is created in the membrane 102 between the area over the recess 108 and the "rim" (where the substrate 104 operates as a heat sink). Many of the thermocouples 100 can then be arranged into a thermopile so as to be able to ascertain readable and reliable temperature measurements.

Thermocouple 100, however, has numerous drawbacks. First, the deep selective etching used to form recess 108 is a non-standard manufacturing step, which can dramatically increase the manufacturing costs. Second, the membrane 102 is very fragile, which generally requires special handling and packaging and which generally makes the membrane sensitive to pressure and vibration. Additionally, because of the fragility of the membrane 102, the size of the membrane is mechanically limited.

Turning to FIG. 2, another, alternative thermopile 200 can be seen. Thermopile 200 generally comprises a first set of materials 202-1, 202-2, 202-3, and 202-4 and a second set of materials 204-1, 204-2, 204-3, and 204-4 arranged in a "serpentine" on a silicon substrate 104. As air (or another fluid) traverses the thermopile, a temperature or thermal gradient is formed across the thermopile 200. While the arrangement of thermopile 200 is more mechanically durable than a thermopile having an array of thermocouples 100, thermopile 200 has very low sensitivity and generally requires a large amount of area, making it prohibitively expensive.

Some other examples of conventional thermocouples and thermopiles are: U.S. Pat. No. 3,393,328; U.S. Pat. No. 5,059,543; U.S. Pat. No. 5,343,064; U.S. Pat. No. 6,531,899; U.S. Pat. No. 6,565,254; U.S. Pat. No. 6,793,389; U.S. Pat. No. 6,987,223; U.S. Pat. No. 7,042,690; U.S. Pat. No. 7,282,712; U.S. Pat. No. 7,406,185; U.S. Patent Pre-Grant Publ. No. 2009/0260669; Paul et al., "Thermoelectric Infrared Imaging Microsystem by Commercial CMOS Technology," *Proc. Eur. Solid-State Device Conf*, Bordeaux, France, Sep. 8-10, 1998, pp. 52-55; and Lahiji et al., "A Batch-Fabricated Silicon Thermopile Infrared Detector," *IEEE Transactions on Electron Devices*, Vol. 29, No. 1, January 1982 pp. 14-22.

SUMMARY

A preferred embodiment of the present invention, accordingly, provides an apparatus is provided. The apparatus comprises a substrate; a thin dielectric layer formed over a first portion of the substrate; a thick dielectric layer formed over a second portion of the substrate; a first conductive layer that extends over at least a portion of each of the thin dielectric layer and the thick dielectric layer, wherein the first conductive layer is made of a first material having a first Seebeck coefficient; a first portion of a second conductive layer that extends over at least a portion of the first conductive layer and the thin dielectric layer, wherein the second layer is made of a second material having a second Seebeck coefficient; a second portion of the second conductive layer that extends over at least a portion of the first conductive layer and the thick dielectric layer; a first conductive via that is formed between the first conductive layer and the first portion of second conductive layers; and a second conductive via that is formed between the first conductive layer and the second portion of the second conductive layer.

In accordance with a preferred embodiment of the present invention, the first conductive layer is formed of polysilicon, and wherein the thin and thick dielectric layers are formed of silicon dioxide, and wherein the second conductive layer is a metallization layer formed of aluminum or copper, and wherein the first and second conductive vias are formed of tungsten or aluminum, and wherein the thin dielectric layer is between about 10 nm and about 12 nm.

In accordance with a preferred embodiment of the present invention, the thick dielectric layer is a field oxide layer that is between 200 nm and about 220 nm.

In accordance with a preferred embodiment of the present invention, the apparatus further comprises: a third conductive layer that extends over at least a portion of each of the first and second portions of the second conductive layer; a third conductive via that is formed between the second and third conductive layer, wherein the third conductive via is generally coextensive with the first conductive via; a fourth conductive via that is formed between the second and third conductive layer, wherein the third conductive via is generally coextensive with the second conductive via; an interconnect layer, wherein the interconnect layer has a higher thermal impedance than the third conductive layer; a fifth conductive via that is formed between the third conductive layer and interconnect layer; and a fourth conductive layer that is adapted to receive infrared radiation; a sixth conductive via that is formed between third conductive layer and the fourth conductive layer, wherein the sixth conductive via is generally coextensive with the second via.

In accordance with a preferred embodiment of the present invention, the third and fourth conductive layers is each formed of aluminum or copper, and wherein the third, fourth, fifth, and sixth conductive vias are formed of aluminum or tungsten, and wherein the interconnect layer is formed of titanium nitride.

In accordance with a preferred embodiment of the present invention, the thick dielectric layer is an isolation region that is between about 200 nm and about 220 nm.

In accordance with a preferred embodiment of the present invention, the apparatus further comprises an absorption layer that extends over the second portion of the second conductive layer.

In accordance with a preferred embodiment of the present invention, the apparatus further comprises a buried layer formed in the substrate below the first portion of the second conductive layer.

In accordance with a preferred embodiment of the present invention, the absorption layer is formed of polyamide.

In accordance with a preferred embodiment of the present invention, the first conductive layer is formed of polysilicon doped with a material of a first conduction type, and wherein the thin and thick dielectric layers are formed of silicon dioxide, and wherein the second conductive layer is formed of polysilicon doped with a material of a second conduction type.

In accordance with a preferred embodiment of the present invention, an apparatus is provided. The apparatus comprises a plurality of thermocouples that are coupled to one another in an array to form a thermopile, wherein each thermocouple includes: a thin dielectric layer; a thick dielectric layer; a first conductive layer that extends over at least a portion of each of the thin dielectric layer and the thick dielectric layer, wherein the first conductive layer is made of a first material having a first Seebeck coefficient; a first portion of a second conductive layer that extends over at least a portion of the first conductive layer and the thin dielectric layer, wherein the second layer is made of a second material having a second Seebeck coefficient; a second portion of the second conductive layer that extends over at least a portion of the first conductive layer and the thick dielectric layer; a first conductive via that is formed between the first conductive layer and the first portion of second conductive layers; and a second conductive via that is formed between the first conductive layer and the second portion of the second conductive layer.

In accordance with a preferred embodiment of the present invention, each thermocouple further comprises: a third conductive layer that extends over at least a portion of each of the first and second portions of the second conductive layer; a third conductive via that is formed between the second and third conductive layer, wherein the third conductive via is generally coextensive with the first conductive via; a fourth conductive via that is formed between the second and third conductive layer, wherein the third conductive via is generally coextensive with the second conductive via; an interconnect layer, wherein the interconnect layer has a higher thermal impedance than the third conductive layer; a fifth conductive via that is formed between the third conductive layer and interconnect layer; a fourth conductive layer that is adapted to receive infrared radiation; a sixth conductive via that is formed between third conductive layer and the fourth conductive layer, wherein the sixth conductive via is generally coextensive with the second via; and a seventh conductive via that is formed between the second conductive layer and the third conductive layer, wherein the seventh conductive via is generally coextensive with the first conductive via so that the first portion of the second conductive layer is electrically connected to an adjacent thermocouple.

In accordance with a preferred embodiment of the present invention, each thermocouple further comprises: an absorption layer that extends over the second portion of the second conductive layer; and a buried layer formed in the substrate below the first portion of the second conductive layer.

In accordance with a preferred embodiment of the present invention, the apparatus further comprises: an amplifier that is coupled to the thermopile; an analog-to-digital converter (ADC) that is coupled to the amplifier; a digital linearization engine that is coupled to the ADC; and an interface that is coupled to the digital linearization engine.

In accordance with a preferred embodiment of the present invention, the ADC is a sigma-delta ADC.

In accordance with a preferred embodiment of the present invention, the interface is an SMBus compatible interface.

In accordance with a preferred embodiment of the present invention, a method of manufacturing a thermocouple is provided. The method comprises forming a thick dielectric layer and a thin dielectric layer over a substrate; forming a first conductive layer that extends over at least a portion of each of the thick and thin dielectric layers, wherein the first conductive layer has a first Seebeck coefficient; forming an oxide layer over the first conductive layer; etching the oxide layer to form a first aperture that is generally coextensive with at least a portion of the first conductive layer and the thin dielectric layer and to form a second aperture that is generally coextensive with at least a portion of the first conductive layer and the thick dielectric layer; filling the first and second apertures to form first and second conductive vias; forming a second conductive layer over the oxide layer, wherein the second conductive layer has a second Seebeck coefficient; and etching the second conductive layer to form first and second portions of the second conductive layer that are substantially electrically isolated from one another.

In accordance with a preferred embodiment of the present invention, the metallization layer further comprises a first metallization layer, and wherein the oxide layer further comprises a first oxide layer, and wherein the method further comprises: forming a second oxide layer over the first metallization layer; forming an interconnect layer over the second oxide layer; forming a third oxide layer over the interconnect layer; etching the second and third oxide layers to form: a third aperture that is generally coextensive with the first conductive via; a fourth aperture that is generally coextensive with the second conductive via; a fifth aperture that is generally coextensive with at least a portion of the interconnect layer; and a sixth aperture that is generally coextensive with at least a portion of the interconnect layer; filling the third, fourth, fifth, and sixth apertures to form third, fourth, fifth, and sixth conductive vias; forming a second metallization layer over the third oxide layer; and etching the second metallization layer so that fourth and fifth conductive vias are electrically connected, that the third conductive via is electrically connected to a first adjacent thermocouple, and that the sixth conductive via is electrically connected to a second adjacent thermocouple.

In accordance with a preferred embodiment of the present invention, the oxide layer further comprises a first oxide layer, and wherein the first and second portions of the metallization layer are electrically connected to first and second adjacent thermocouples, and wherein the method further comprises: forming a buried layer in the substrate underneath the first conductive via; forming a second oxide layer over the metallization layer; and forming an absorption layer over the second via.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
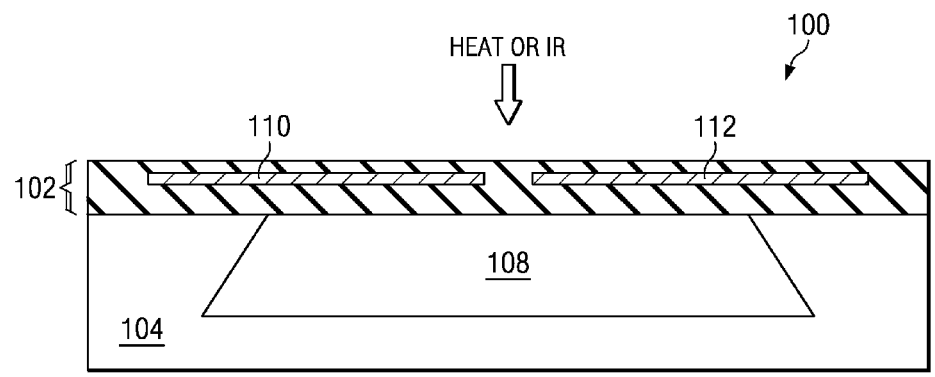
FIG. 1 is an example of a conventional thermocouple.
Figure 2:
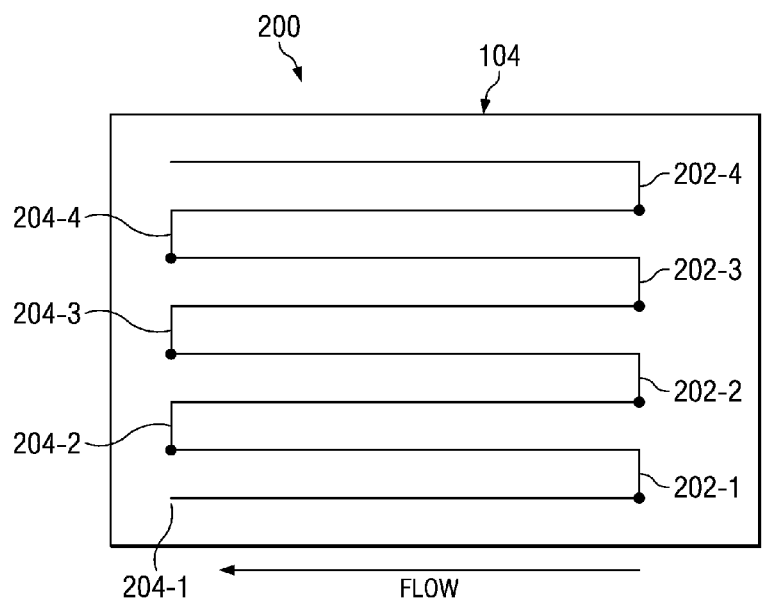
FIG. 2 is an example of a conventional thermopile.

Refer now to the drawings wherein depicted elements are, for the sake of clarity, not necessarily shown to scale and wherein like or similar elements are designated by the same reference numeral through the several views.

Figure 3A:
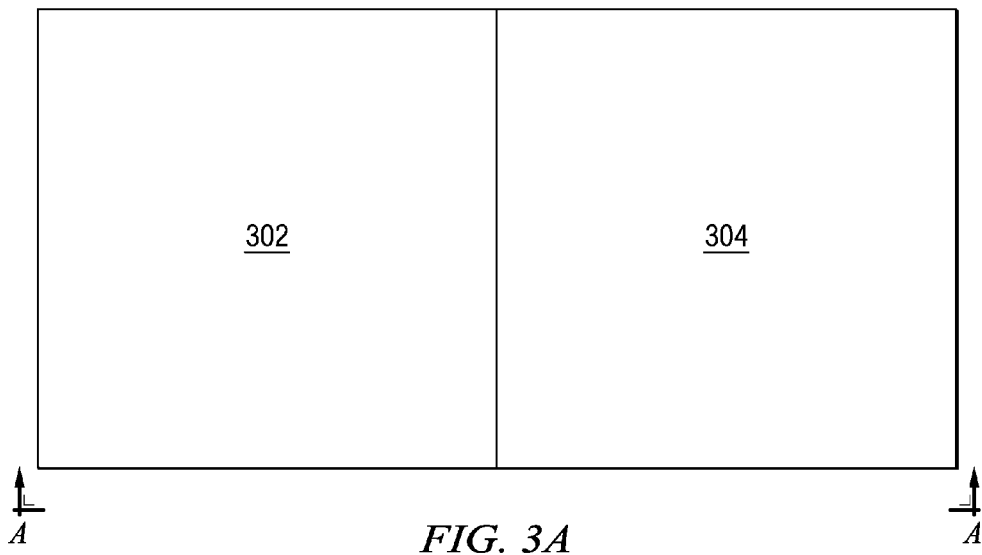
FIG. 3A is a plan view of an example of a process step for forming a thermocouple in accordance with a preferred embodiment of the present invention.
Figure 3B:
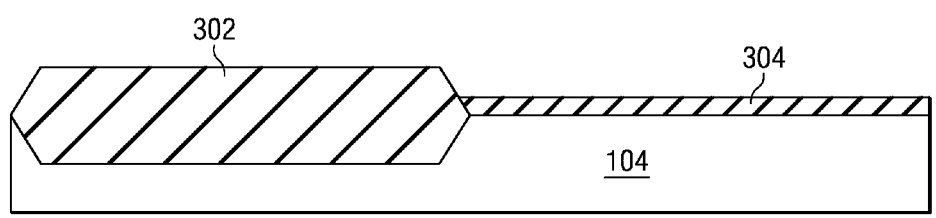
FIG. 3B is a elevation view of the process step along section line A-A.
Figure 10A:
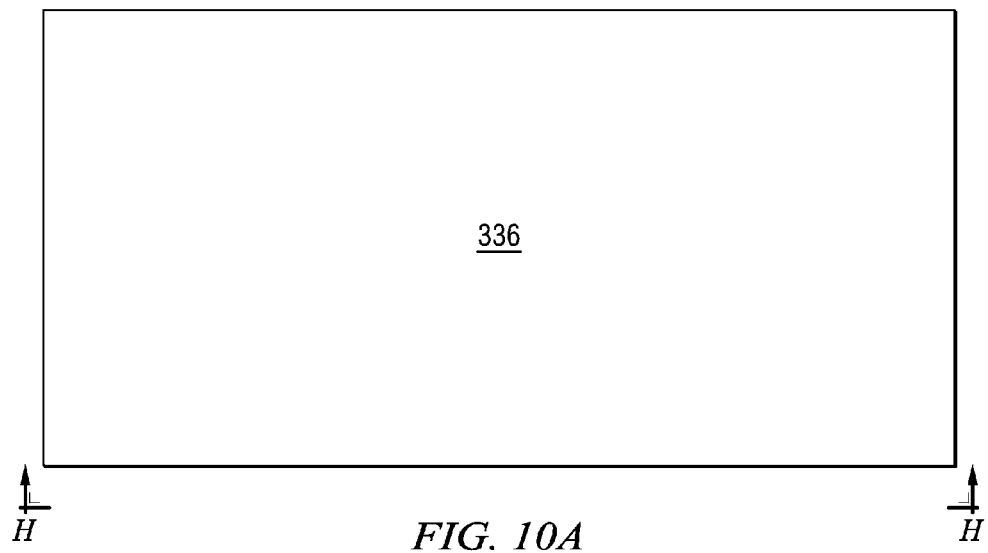
FIG. 10A is a plan view of an example of a process step for forming a thermocouple in accordance with a preferred embodiment of the present invention.
Figure 10B:
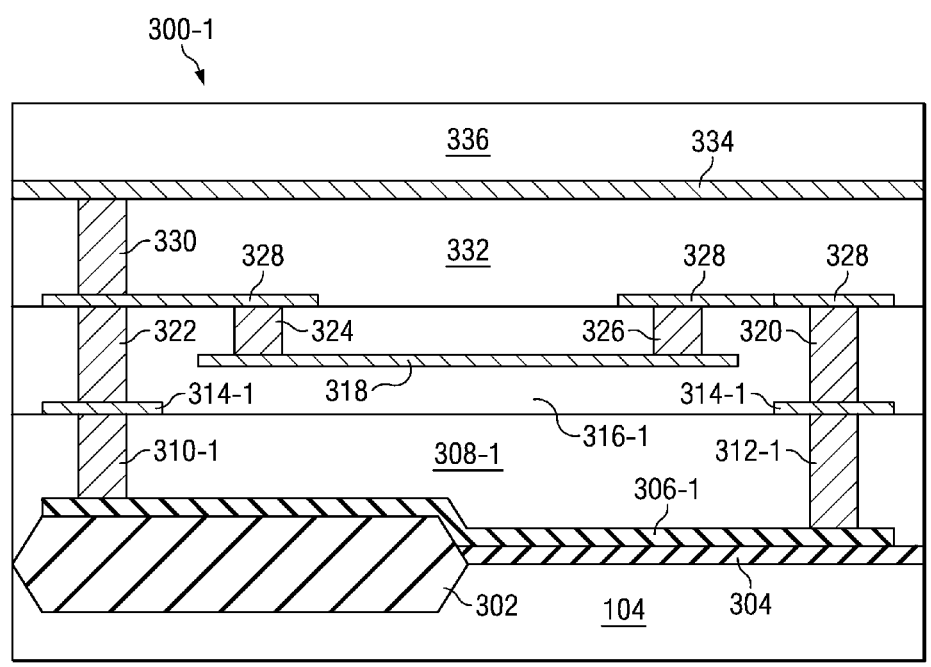
FIG. 10B is a elevation view of the process step along section line H-H.
Figure 11A:
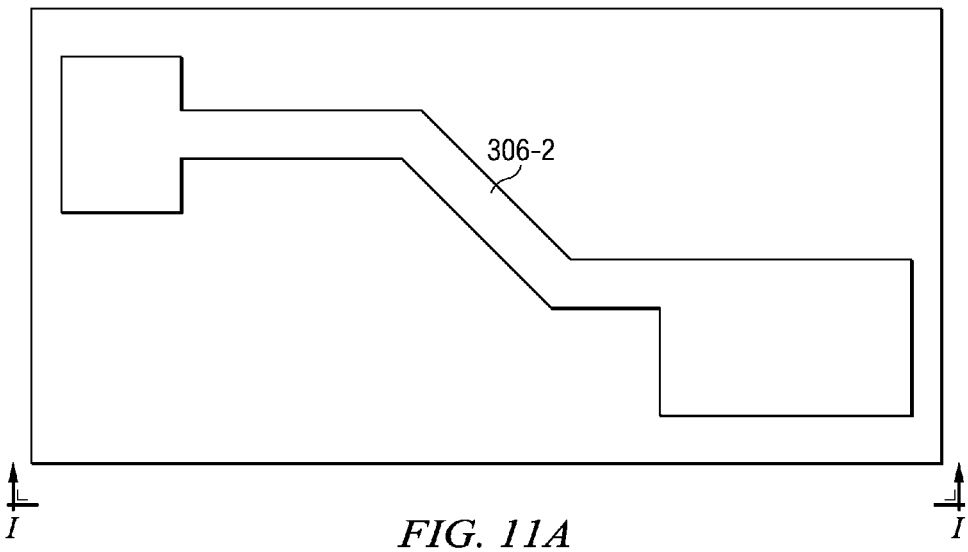
FIG. 11A is a plan view of an example of a process step for forming a thermocouple in accordance with a preferred embodiment of the present invention.
Figure 11B:
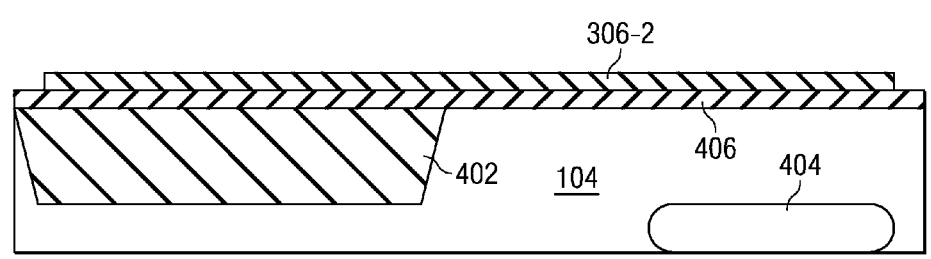
FIG. 11B is a elevation view of the process step along section line I-I.
Figure 12A:
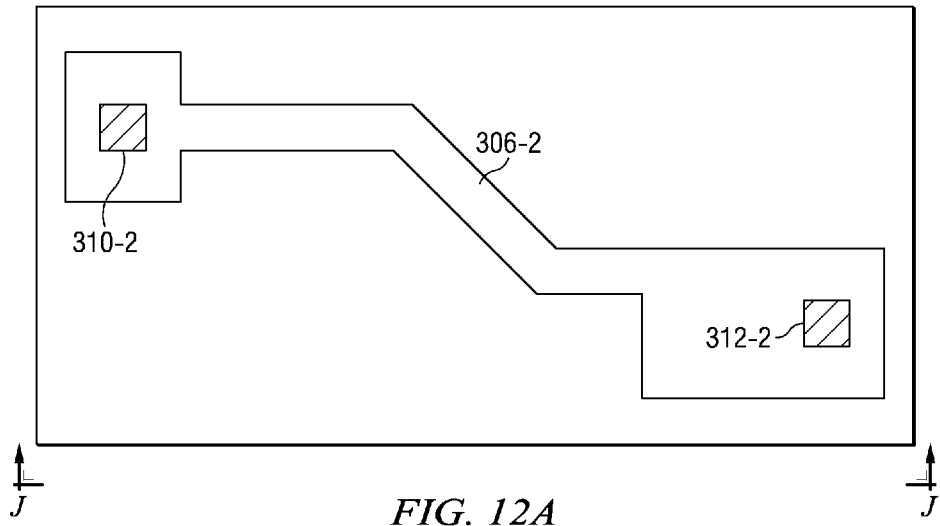
FIG. 12A is a plan view of an example of a process step for forming a thermocouple in accordance with a preferred embodiment of the present invention.
Figure 12B:
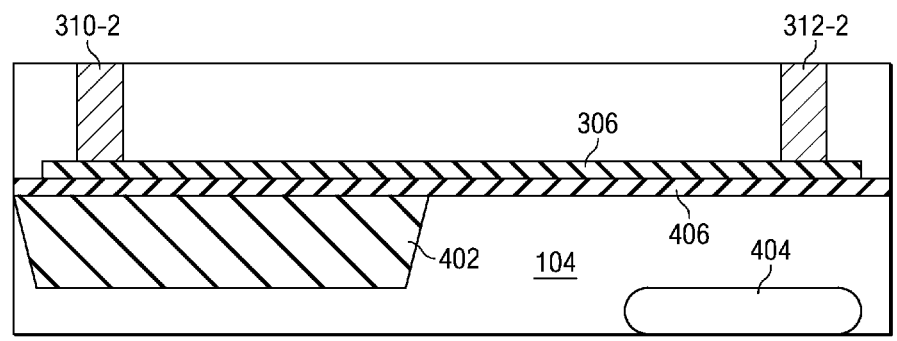
FIG. 12B is a elevation view of the process step along section line J-J.
Figure 13A:
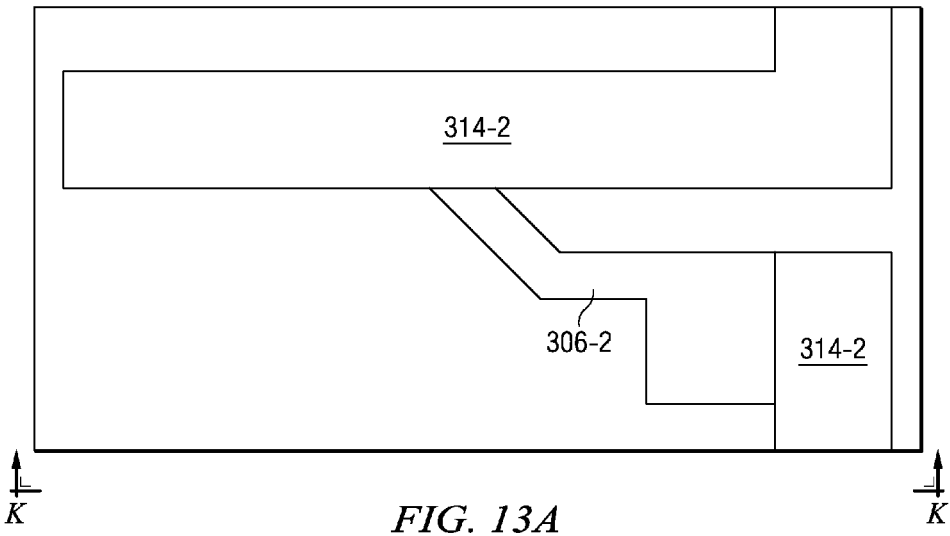
FIG. 13A is a plan view of an example of a process step for forming a thermocouple in accordance with a preferred embodiment of the present invention.
Figure 13B:
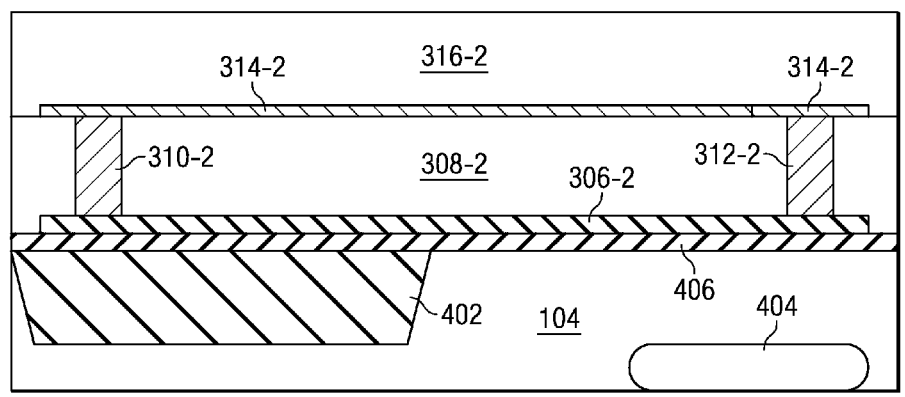
FIG. 13B is a elevation view of the process step along section line K-K.

Turning first to FIGS. 3A to 10B, the process for forming a thermocouple 300-1 (as shown in FIG. 10B) can be seen. Initially, as can be seen in FIGS. 3A and 3B, a thin dielectric layer 304 and a thick dielectric layer or field oxide layer 302 are formed over the substrate 104. Typically, these layers 302 and 304 are formed of silicon dioxide and are grown on the substrate 104 through one or more conventional oxidation process steps. The thin oxide layer 304 can be between about 10 nm and about 12 nm thick, while the field oxide layer 302 can be between about 200 nm and about 220 nm thick. Additionally, substrate 104 can be formed of silicon, but substrate 104 may also be made of several other suitable materials.

Figure 4A:
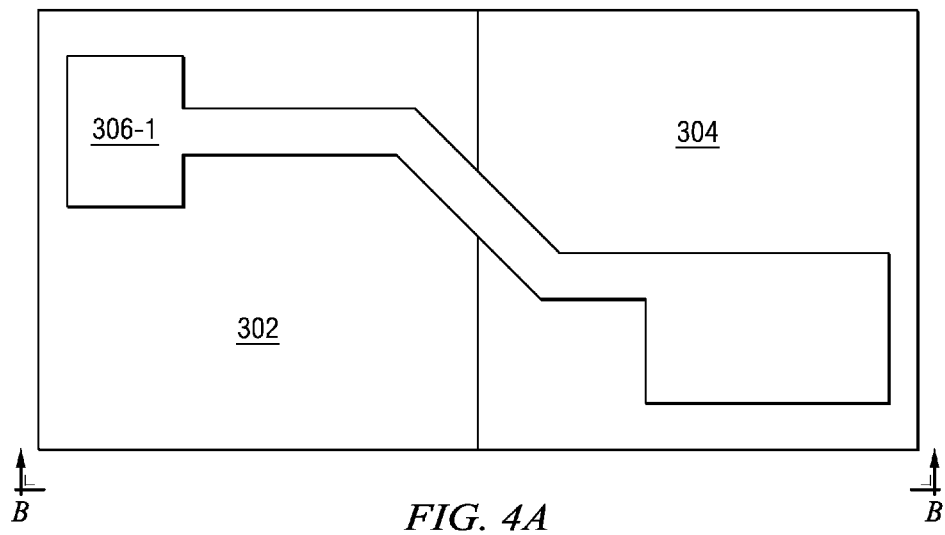
FIG. 4A is a plan view of an example of a process step for forming a thermocouple in accordance with a preferred embodiment of the present invention.
Figure 4B:
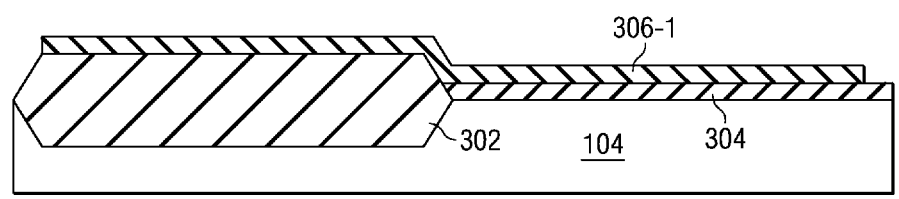
FIG. 4B is a elevation view of the process step along section line B-B.

Following the formation of the dielectric layers 302 and 304, a conductive layer 306-1 is formed over dielectric layers 302, as seen in FIGS. 4A and 4B. Typically, this conductive layer 306-1 is formed of polysilicon, which has a Seebeck coefficient of about 40 μV/K and which is one of the thermally conductive materials used to form the thermocouple 300-1. In the formation of conductive layer 306-1, a layer of polysilicon is generally formed over layers 302 and 304, which is then patterned an etched to form the shape seen in the plan view of FIG. 4A. The conductive layer 306-1 can also be doped with either a P-type material (such as boron, indium, or aluminum) or N-type material (such as phosphorous, arsenic, and antimony).

Figure 5A:
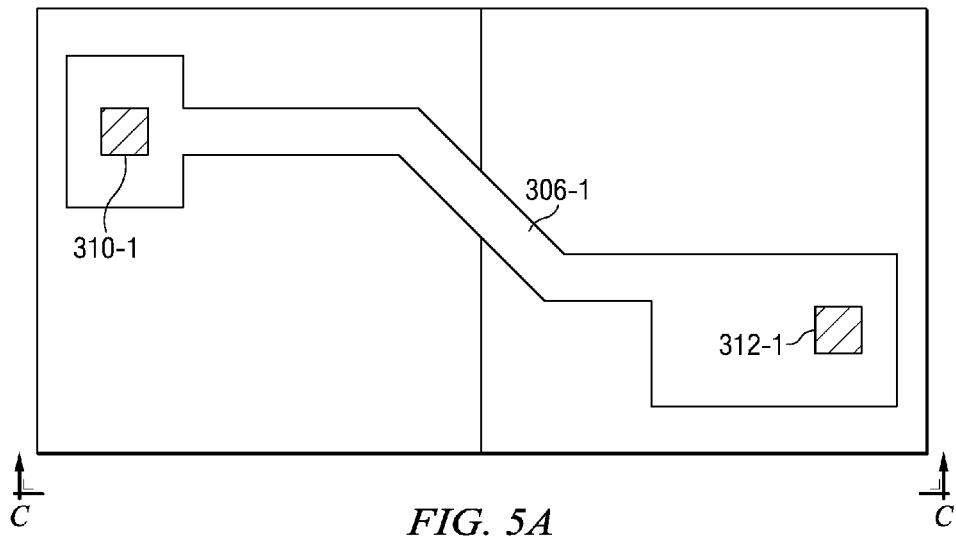
FIG. 5A is a plan view of an example of a process step for forming a thermocouple in accordance with a preferred embodiment of the present invention.
Figure 5B:
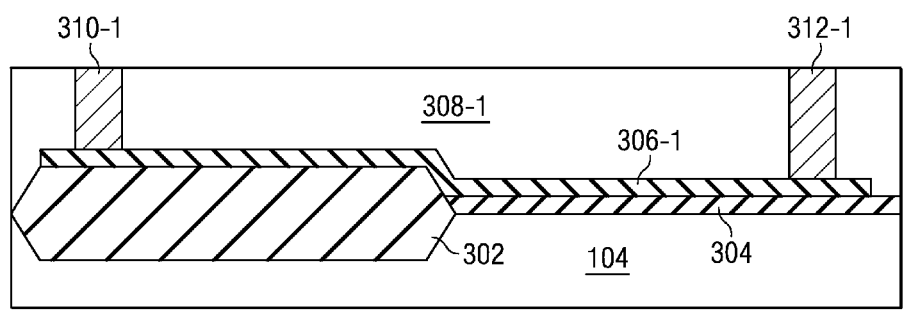
FIG. 5B is a elevation view of the process step along section line C-C.

Turning to FIGS. 5A and 5B, conductive contacts are formed with the conductive layer 306-1. To accomplish this, a dielectric layer (typically silicon dioxide) 308-1 is formed over the conductive layer 306-1 and is patterned and etched (forming apertures that are each generally or partially coextensive with the conductive layer 306-1 and one of the layers 304 or 302. These apertures are then filled with a conductive material (i.e., tungsten or aluminum) to form vias 310-1 and 312-1.

Figure 7A:
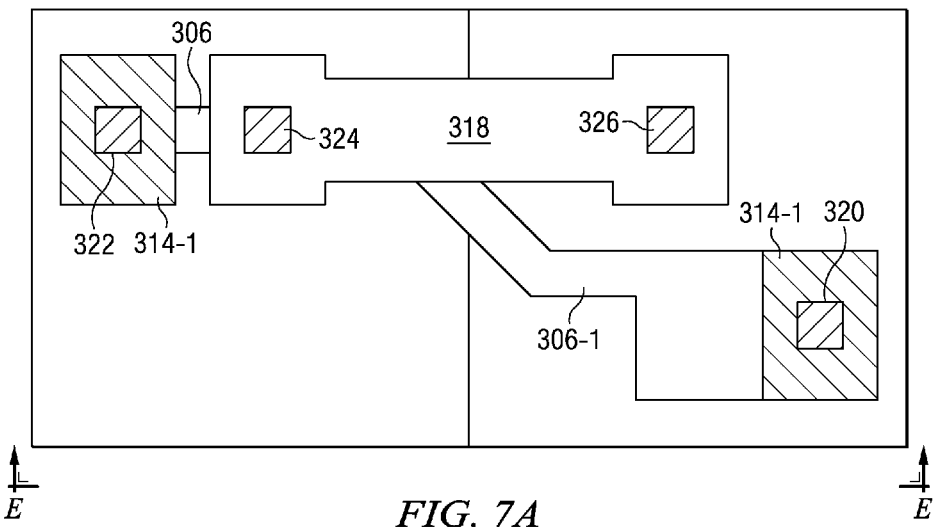
FIG. 7A is a plan view of an example of a process step for forming a thermocouple in accordance with a preferred embodiment of the present invention.
Figure 7B:
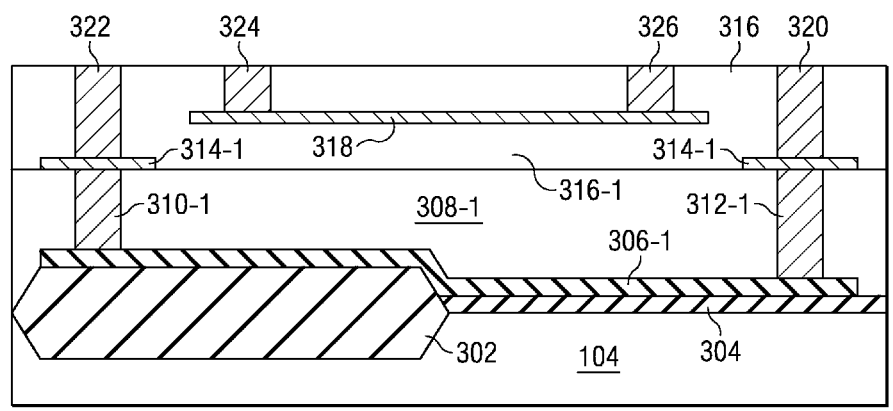
FIG. 7B is a elevation view of the process step along section line E-E.
Figure 8A:
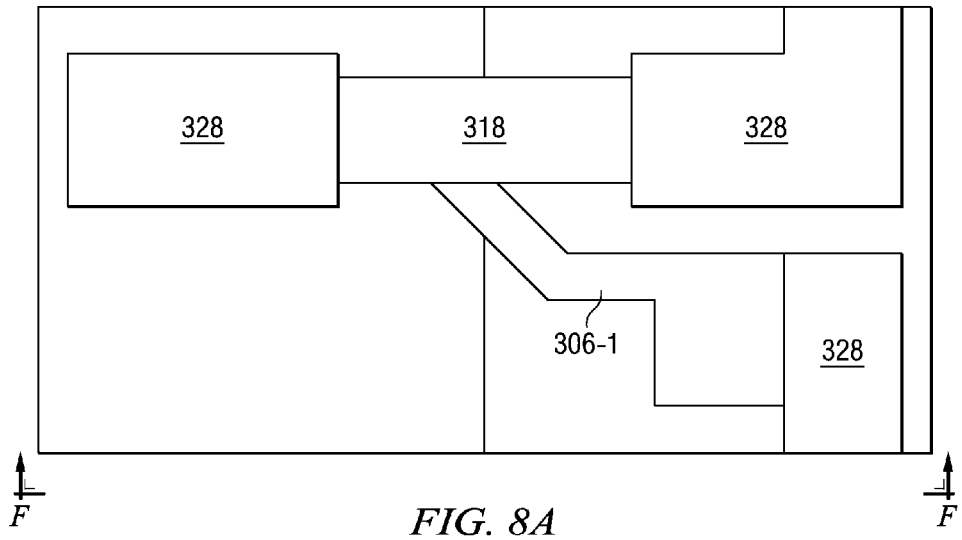
FIG. 8A is a plan view of an example of a process step for forming a thermocouple in accordance with a preferred embodiment of the present invention.
Figure 8B:
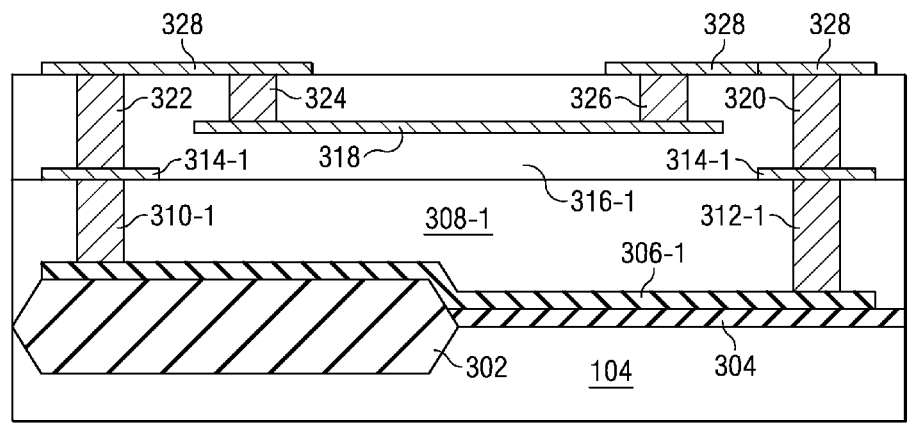
FIG. 8B is a elevation view of the process step along section line F-F.
Figure 9A:
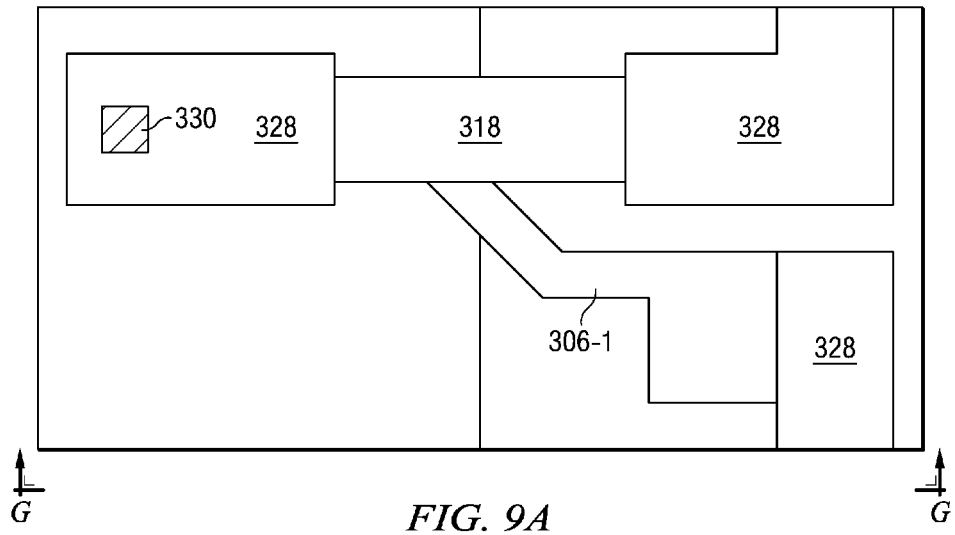
FIG. 9A is a plan view of an example of a process step for forming a thermocouple in accordance with a preferred embodiment of the present invention.
Figure 9B:
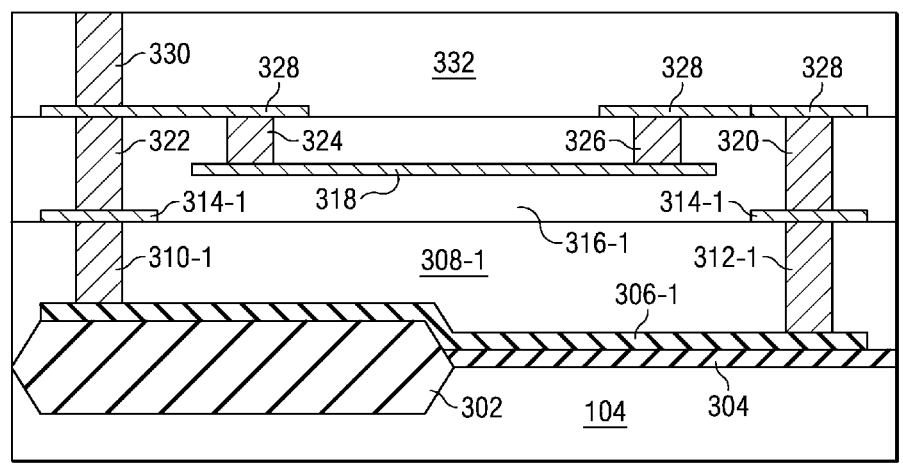
FIG. 9B is a elevation view of the process step along section line G-G.

Tuning to FIGS. 7A and 7B, additional connective layers are formed. A dielectric layer (i.e., portion of dielectric layer 316-1) is first formed over the metallization layer 314-1 (and the dielectric layer 308-1), and an interconnect layer is formed (i.e., deposited and etched). Then, the remainder of the dielectric layer 316-1 is formed. As with the previous dielectric layer 308-1, apertures are formed and filled with a conductive material (i.e., aluminum or tungsten) to form vias 320, 322, 324, and 326. Typically, the interconnect layer 318 (which operates as a connective layer between adjacent thermocouples, such as thermocouple 300-1) is formed of a material that has good electrical conductivity, with a higher thermal impedance than the materials used for metallization layers 314-1 and 328 so as to assisting in providing an interconnect path. For example, interconnect layer 318 can be formed of titanium nitride. By using such a material, "hot" junctions of one thermocouple 300-1 can be thermally isolated from "cold" junctions in an adjacent thermocouple (i.e., thermocouple 300-1) with these interconnect paths.

Tuning to FIGS. 7A and 7B, additional connective layers are formed. A dielectric layer (i.e., portion of dielectric layer 316-1) is first formed over the metallization layer 314-1 (and the dielectric layer 308-1), and an interconnect layer is formed (i.e., deposited and etched). Then, the remainder of the dielectric layer 316-1 is formed. As with the previous dielectric layer 308-1, apertures are formed and filled with a conductive material (i.e., aluminum or tungsten) to form vias 320, 322, 324, and 326. Typically, the interconnect layer 318 (which operates as a connective layer between adjacent thermocouples, such as thermocouple 300-1) is formed of a material that has good electrical conductivity, with a higher thermal impedance than the materials used for metallization layers 314-1 and 328. For example, interconnect layer 318 can be formed of titanium nitride. By using such a material, "hot" junctions of one thermocouple 300-1 can be thermally isolated from "cold" junctions in an adjacent thermocouple (i.e., thermocouple 300-1).

Once the metallization layer 328 is formed, an additional via 330 and third metallization layer 334 are formed (which is shown in FIGS. 9A through 10B). As with the other vias 310-1, 312-1, 320, 322, 324, 326, via 330 is formed of a conductive material (i.e., tungsten or aluminum) that is deposited in an aperture in dielectric layer 332 (i.e., silicon dioxide). The third metallization layer 334 is then formed over the cell so as to conduct heat to the "hot junction" with a conductive path being formed to layer 306-1 through vias 310-1, 322, and 330 and layers 314-1 and 328. Additionally, an absorber 336 can be formed over the metallization layer 334; typically, this absorber 336 can be formed of polyamide or any other suitable infrared or heat absorber.

Once the metallization layer 328 is formed, an additional via 330 and third metallization layer 334 are formed (which is shown in FIGS. 9A through 10B). As with the other vias 310-1, 312-1, 320, 322, 324, 326, via 330 is formed of a conductive material (i.e., tungsten or aluminum) that is deposited in an aperture in dielectric layer 332 (i.e., silicon dioxide). The third metallization layer 334 is then formed over the cell so as to conduct heat to the "hot junction." Additionally, an absorber 336 can be formed over the metallization layer 334; typically, this absorber 336 can be formed of polyamide or any other suitable infrared or heat absorber.

In operation, cell or thermocouple 300-1 is able to use the Peltier-Seebeck effect to generate a voltage. Heat or infrared radiation is applied to the metallization layer 334, which is transferred through metallization layers 328 and 314-1 and vias 330, 322, and 310-1 to conductive layer 306-1. Since the thick dielectric layer 302 (which is a filed oxide layer) is a less thermally conductive than thin oxide layer 304 due to their relative thicknesses, a "hot" junction is formed at junction between via 310-1 and conductive layer 306-1, and a "cold" junction is formed at the junction between the conductive layer 306-1 and via 312-1. Thus, because of the dissimilar materials of the conductive layer 306-1 and metallization or conductive layers 314-1 and 328, a voltage is generated when infrared radiation or heat is applied to metallization or conductive layer 334.

Figure 6A:
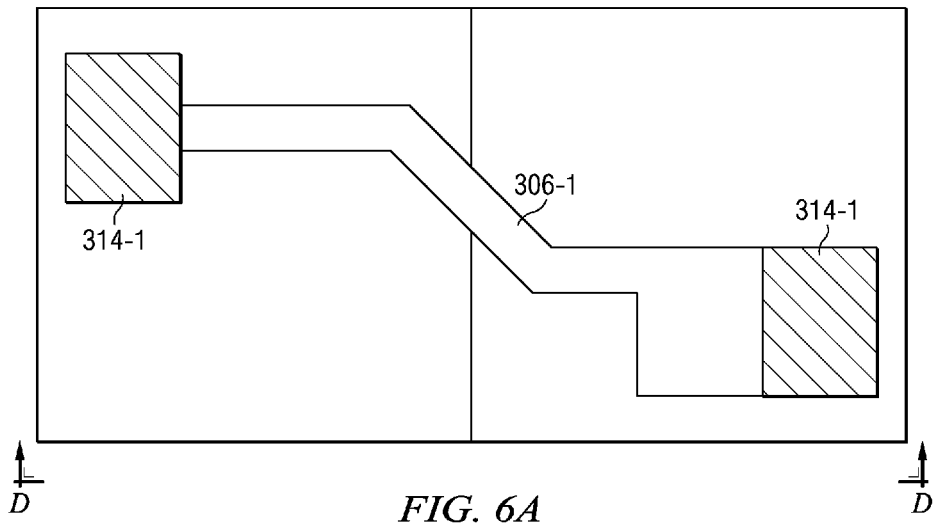
FIG. 6A is a plan view of an example of a process step for forming a thermocouple in accordance with a preferred embodiment of the present invention.
Figure 6B:
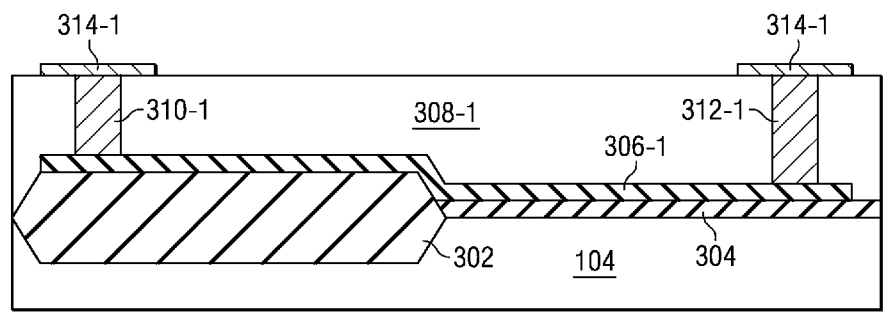
FIG. 6B is a elevation view of the process step along section line D-D.
Figure 14A:
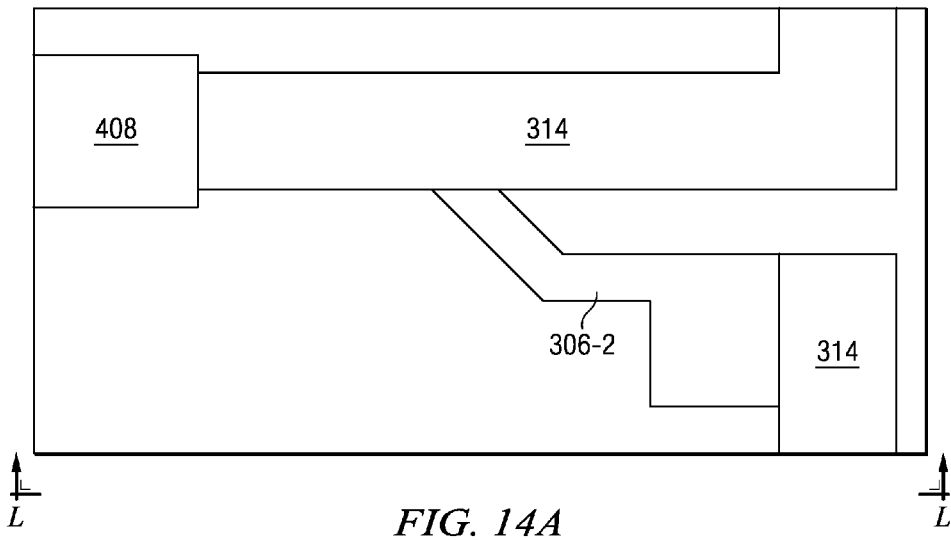
FIG. 14A is a plan view of an example of a process step for forming a thermocouple in accordance with a preferred embodiment of the present invention.
Figure 14B:
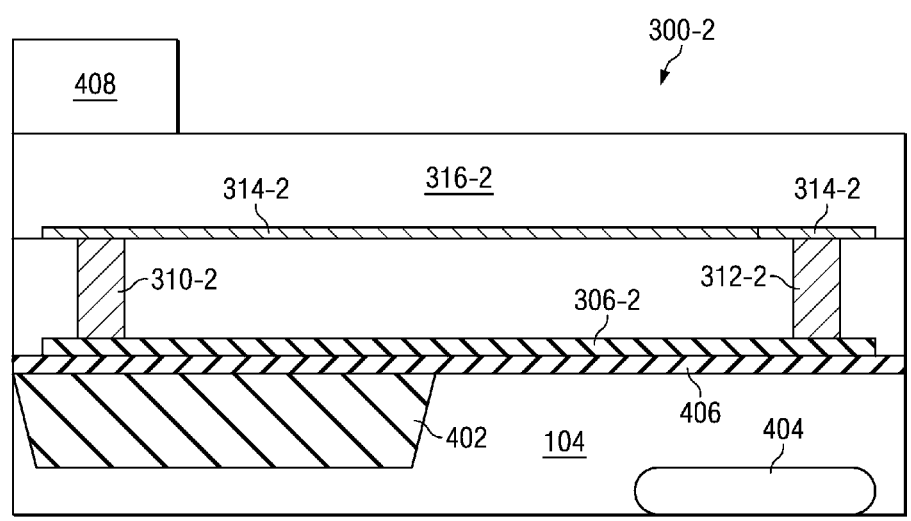
FIG. 14B is a elevation view of the process step along section line L-L.

As an alternative or additional feature, polymers and/or buried layers can be used for infrared absorption. Turning to FIGS. 11A to 13B, a structure that is similar to the structure of FIGS. 6A and 6B is formed. Some differences are: (1) that dielectric layer 302 is replaced with an isolation region 402 (i.e., shallow trench isolation or deep trench isolation) with oxide layer 406 extending over the isolation region 402; (2) that a buried layer 404 (which is generally comprised of an implanted or diffused dopant and is generally coextensive with or generally aligned with via 312-2) is provided in the substrate 104; and (3) that the "pads" or portions of metallization layer 314-2 are electrically connected to adjacent cells. Additionally, as shown in FIGS. 14A and 14B, an absorption layer 408 (which is generally formed of polyamide) is formed on the dielectric layer 316-2 so as to be generally coextensive with via 310-2. Typically, the buried layer is heavily doped with either a P-type material (such as boron, indium, or aluminum) or N-type material (such as phosphorous, arsenic, and antimony).

As a result of the configuration of cell or thermocouple 300-2 allows for absorption from both the top and bottom. Both the buried layer 404 and the absorption layer 408 operate to "trap" infrared radiation. Regardless of the direction of the radiation, heat is trapped on the "hot" junction (junction between via 310-2 and conductive layer 603-2) and is dissipated into the substrate 104 on the "cold" junction (junction between via 312-2 and conductive layer 306-2). Therefore, similar to thermocouple 300-1, thermocouple 300-2 generates a voltage when infrared radiation is received.

Figure 15:
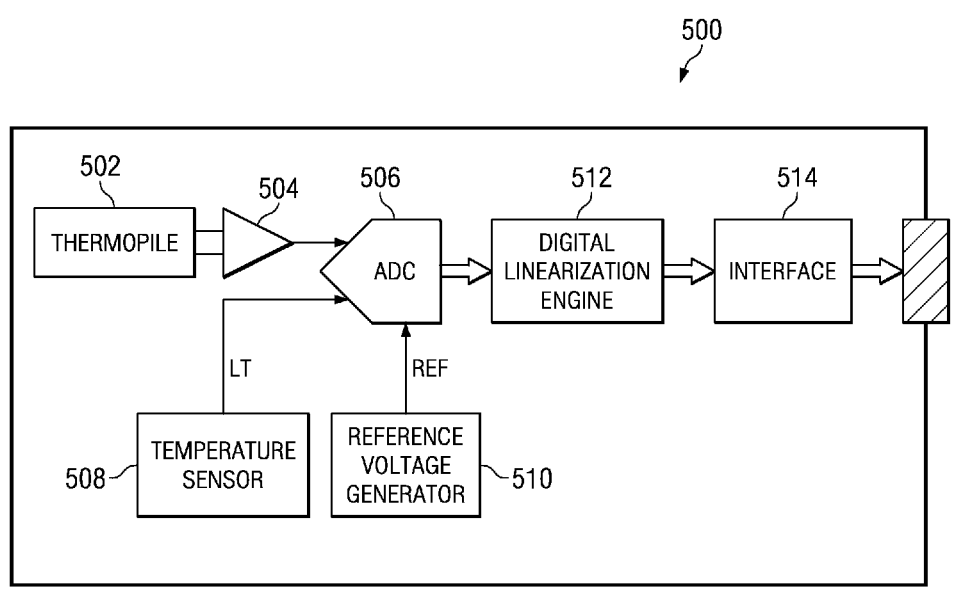
FIG. 15 is an example of an integrate circuit (IC) that employs the thermocouples show in process steps of FIGS. 3A to 14B.

Turning to FIG. 15, an example of an application of thermocouples 300-1 and/or 300-2 can be seen. Generally, thermocouples 300-1 and/or 300-2 are formed as part of an integrated circuit (IC). Cells or thermocouples 300-1 and/300-2 (which are each about 7.5 $\mu m^2$) are arranged in an array to form thermopile 502. Typically, thermopile 502 includes tens of thousands of cells or thermocouples 300-1 and 300-2. The thermopile 502 is coupled to an amplifier 504, and an amplified signal is provided to analog-to-digital converter (ADC) 506. Typically, ADC 506 is a sigma-delta ADC that receives a local temperature LT from temperature sensor 508 and a reference voltage REF from reference voltage generator 510. The digital representation of the amplified signal is linearized by the digital linearization engine 512 and provided to interface 514 (which is generally SMBus compatible).

As a result of using cells or thermocouples 300-1 and/or 300-2, several advantages can be realized over conventional thermocouples. Thermocouples 300-1 and/or 300-2 are fully compatible with the standard semiconductor manufacturing processes. There are no extra processing steps, and the cost per wafer is equal to the base cost per wafer for the used process. There are no restrictions on the thermopile 502 size. The desired sensitivity and signal to noise ratio can be achieved by scaling up the thermopile 502. Thermocouples 300-1 and/or 300-2 have mechanical robustness that is generally equal to the robustness of the silicon chip itself. Thermocouples 300-1 and/or 300-2 are also not sensitive to pressure and/or vibrations or to chemical and/or ion contamination.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. A method of manufacturing a thermocouple comprising:
   forming a thick dielectric layer and a thin dielectric layer formed over a first portion of a substrate;
   forming a first portion of a first conductive layer that extends over at least a portion of the thin dielectric layer, wherein the first layer is made of a first material having a first Seebeck coefficient;
   forming a second portion of the first conductive layer that extends over at least a portion of the thick dielectric layer;
   forming an oxide layer over the first conductive layer;
   etching the oxide layer to form a first aperture that is generally coextensive with at least a portion of the first conductive layer and the thin dielectric layer and to form a second aperture that is generally coextensive with at least a portion of the first conductive layer and the thick dielectric layer;
   filling the first and second apertures to form first and second conductive paths that is formed between the second conductive layer and the second portion of the first conductive layer, wherein the first and second conductive paths have a second Seebeck coefficient;

forming a first interconnect path that is coupled to the first portion of the first conductive layer, and wherein the first interconnect path has a third Seebeck coefficient; and forming a second conductive layer over the oxide layer, wherein the second conductive layer extends over at least a portion of each of the thin dielectric layer and the thick dielectric layer, wherein the second conductive layer is configured to receive infrared radiation so as to create a vertical temperature gradient between the second conductive layer and the substrate, forming a second interconnect path that is coupled to the second portion of the first conductive layer; and etching the second conductive layer to form first and second portions of the second conductive layer that are substantially electrically isolated from one another.

2. The method of claim 1, wherein the second and third Seebeck coefficients are substantially the same, wherein the first conductive layer is formed of polysilicon, and wherein the thin and thick dielectric layers are formed of silicon dioxide, and wherein the second conductive layer is a metallization layer is formed of aluminum or copper, and wherein the thin dielectric layer is between about 10 nm and about 12 nm.

3. The method of claim 2, wherein the thick dielectric is a field oxide layer that is between about 200 nm and about 220 nm.

4. The method of claim 3, wherein the metallization layer further comprises a first metallization layer, and wherein the oxide layer further comprises a first oxide layer, and wherein the method further comprises:

forming a second oxide layer over the first metallization layer;

forming an interconnect layer over the second oxide layer;

forming a third oxide layer over the interconnect layer;

etching the second and third oxide layers to form:

a third aperture that is generally coextensive with the first conductive via;

a fourth aperture that is generally coextensive with the second conductive via;

a fifth aperture that is generally coextensive with at least a portion of the interconnect layer; and a sixth aperture that is generally coextensive with at least a portion of the interconnect layer;

filling the third, fourth, fifth, and sixth apertures to form third, fourth, fifth, and sixth conductive vias;

forming a second metallization layer over the third oxide layer; and etching the second metallization layer so that fourth and fifth conductive vias are electrically connected, that the third conductive via is electrically connected to a first adjacent thermocouple, and that the sixth conductive via is electrically connected to a second adjacent thermocouple.

5. The method of claim 2, wherein the second metallization layer is formed of aluminum or copper, and wherein the third, fourth, fifth, and sixth conductive vias are formed of aluminum or tungsten, and wherein the interconnect layer is formed of titanium nitride.

6. The method of claim 4, wherein the thick dielectric layer is an isolation region that is between about 200 nm and about 220 nm.

7. The method of claim 6, wherein the oxide layer further comprises a first oxide layer, and wherein the first and second portions of the metallization layer are electrically connected to first and second adjacent thermocouples, and wherein the method further comprises:

forming a buried layer in the substrate underneath the first conductive via;

forming a second oxide layer over the metallization layer; and forming an absorption layer over the second via.

8. The method of claim 7, wherein the absorption layer is formed of polyamide.

9. The apparatus of claim 1, wherein the first conductive layer is formed of polysilicon doped with a material of a first conduction type, and wherein the second conductive layer is formed of polysilicon doped with a material of a second conduction type.

10. A method comprising:

forming a thin dielectric layer formed over a first portion of a substrate;

forming a thick dielectric layer formed over a second portion of the substrate;

forming a first portion of a first conductive layer that extends over at least a portion of the thin dielectric layer, wherein the first layer is made of a first material having a first Seebeck coefficient;

forming a second portion of the first conductive layer that extends over at least a portion of the thick dielectric layer;

forming an oxide layer over the first conductive layer;

etching the oxide layer to form a first aperture that is generally coextensive with at least a portion of the first conductive layer and the thin dielectric layer and to form a second aperture that is generally coextensive with at least a portion of the first conductive layer and the thick dielectric layer;

filling the first and second apertures to form first and second conductive paths that is formed between the second conductive layer and the second portion of the first conductive layer, wherein the first and second conductive paths have a second Seebeck coefficient;

forming a first interconnect path that is coupled to the first portion of the first conductive layer, and wherein the first interconnect path has a third Seebeck coefficient; and forming a second conductive layer that extends over at least a portion of each of the thin dielectric layer and the thick dielectric layer, wherein the second conductive layer is configured to receive infrared radiation so as to create a vertical temperature gradient between the second conductive layer and the substrate;

forming a conductive path between the second conductive layer and the second portion of first conductive layers, wherein the conductive path has a second Seebeck coefficient;

forming a first interconnect path that is coupled to the first portion of the first conductive layer, and wherein the first interconnect path has a third Seebeck coefficient; and forming a second interconnect path that is coupled to the second portion of the first conductive layer.

11. The method of claim 10, wherein the second and third Seebeck coefficients are substantially the same, and wherein the first conductive layer is formed of polysilicon, and wherein the thin and thick dielectric layers are formed of silicon dioxide, and wherein the second conductive layer is a metallization layer formed of aluminum or copper, and wherein the thin dielectric layer is between about 10 nm and about 12 nm.

12. The method of claim 11, wherein the thick dielectric layer is a field oxide layer that is between about 200 nm and about 220 nm.

13. The method of claim 12, wherein the method further comprises:

forming a first portion of a third conductive layer that extends over at least a portion of the first portion of the first conductive layer;

forming a second portion third conductive layer that extends over at least a portion of the second portion of the first conductive layer;

forming a first conductive via between the first portion of the first conductive layer and the first portion of the third conductive layer;

forming a second conductive via between the second portion of the first conductive layer and the second portion of the third conductive layer;

forming first, second, and third portions of a fourth conductive layer;

forming an interconnect layer, wherein the interconnect layer has a higher thermal impedance than the third conductive layer;

forming a third conductive via between the first portion of the third conductive layer and third portion of the fourth conductive layer;

forming a fourth conductive via between the first portion of the fourth conductive layer and the interconnect layer;

forming a fifth conductive via between the interconnect layer and the second portion of the fourth conductive layer;

forming a sixth conductive via between second portion of third conductive layer and the first portion of the fourth conductive layer; and forming a seventh via between the first portion of the fourth conductive layer and the second conductive layer, wherein the second conductive via, the second portion of the third conductive layer, the sixth conductive via, the first portion of the fourth conductive layer, and the seventh conductive via form at least a portion of the conductive path, and wherein the first portion of the fourth conductive layer, the fourth conductive via, the interconnect layer, the fifth conductive via, and the second portion of the fourth conductive layer form at least a portion of the first interconnect path, and wherein the first conductive via, the first portion of the third conductive layer, the third conductive via, and the third portion of the fourth conductive layer form at least a portion of the second interconnect path.

14. The method of claim 13, wherein the third and fourth conductive layers is each formed of aluminum or copper, and wherein the first, second, third, fourth, fifth, and sixth conductive vias are formed of aluminum or tungsten, and wherein the interconnect layer is formed of titanium nitride.

15. The method of claim 10, wherein the first conductive layer is formed of polysilicon doped with a material of a first conduction type, and wherein the thin and thick dielectric layers are formed of silicon dioxide.

* * * * *